US006784026B2

(12) United States Patent
Parks

(10) Patent No.: US 6,784,026 B2
(45) Date of Patent: Aug. 31, 2004

(54) MICROELECTRONIC DIE INCLUDING LOW RC UNDER-LAYER INTERCONNECTS

(75) Inventor: Jay S. Parks, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/428,449

(22) Filed: Apr. 30, 2003

(65) Prior Publication Data

US 2003/0205732 A1 Nov. 6, 2003

Related U.S. Application Data

(62) Division of application No. 10/095,362, filed on Mar. 11, 2002, now Pat. No. 6,624,515.

(51) Int. Cl.$^7$ .............................................. H01L 21/44
(52) U.S. Cl. ...................................... 438/118; 438/128
(58) Field of Search .................................. 438/118, 622, 438/625, 618, 619, 687; 365/51; 427/97

(56) References Cited

U.S. PATENT DOCUMENTS

| | | | |
|---|---|---|---|
| 3,932,226 A | 1/1976 | Klatskin et al. ............... 204/16 |
| 4,461,041 A | 7/1984 | Dobrovolny ................. 455/328 |
| 4,503,451 A | 3/1985 | Lund et al. .................. 257/374 |
| 4,670,297 A | 6/1987 | Lee et al. ..................... 427/91 |
| 4,857,481 A | 8/1989 | Tam et al. .................... 437/182 |
| 4,939,567 A | 7/1990 | Kenney ........................ 357/42 |
| 4,977,439 A | 12/1990 | Esquivel et al. .............. 357/49 |
| 5,158,986 A | 10/1992 | Cha et al. ..................... 521/82 |
| 5,202,754 A | 4/1993 | Bertin et al. ................. 257/684 |
| 5,227,658 A | 7/1993 | Beyer et al. ................. 257/522 |
| 5,232,866 A | 8/1993 | Beyer et al. ................... 437/62 |
| 5,268,315 A | 12/1993 | Prasad et al. ................. 437/31 |
| 5,270,261 A | 12/1993 | Bertin et al. ................ 437/209 |
| 5,308,440 A | 5/1994 | Chino et al. ................ 156/664 |
| 5,312,775 A * | 5/1994 | Fujii et al. ................... 438/625 |
| 5,334,356 A | 8/1994 | Baldwin et al. ............. 422/133 |

(List continued on next page.)

OTHER PUBLICATIONS

Abidi, "Large Self–Suspended Inductors on Silicon and Their Use in 2–mu m CMOS RF Amplifier", *IEEE Electron Device Letters*, vol. 17, No. 9, (1993),246–48.

Burghartz, et al., "Integrated RF and Microwave Components in BiCMOS Technology", IEEE Trans. Electron Devices, vol. 43, No. 9,(1996), 1559–70.

Burghartz, et al., "Multi–level Spiral Inductors Using VLSI Interconnect Technology", *IEEE Electron Device Letters*, vol. 17, No. 9, (1996),428–30.

Jin, C. , et al., "Porous Xerogel Films as Ultra–low Permittivity Dielectrics for ULSI Interconnect Applications", *Conference Proceedings ULSI XII—1997 Materials Research Society*, (1997),pp. 463–469.

Meyer, et al., "Si IC–Compatible Inductors and LC Passive Filters", *IEEE Journal of Solid State Circuits*, vol. 25, No. 4, (1990), 1028–31.

Miller, R. D., et al., "Low Dielectric Constant Polyimides and Polyimide Nanofoams", *Seventh Meeting of the DuPont Symposium on Polymides in Microelectronics*, (Sep. 1996), pp. 443–473.

(List continued on next page.)

*Primary Examiner*—David Nelms
*Assistant Examiner*—Thinh Nguyen
(74) *Attorney, Agent, or Firm*—Schwegman, Lundberg, Woessner & Kluth, P.A.

(57) ABSTRACT

A microelectronic die comprises a first area, a second area and an under-layer of conductive material formed in the second area to interconnect components. A method of making a microelectronic die comprises forming a layer of insulative material on a substrate; forming at least one trench in the layer of insulative material; and forming at least one line of conductive material in each of the at least one trenches to transmit signals.

24 Claims, 8 Drawing Sheets

U.S. PATENT DOCUMENTS

| | | | |
|---|---|---|---|
| 5,349,743 A | 9/1994 | Grader et al. | 29/602.1 |
| 5,371,390 A | 12/1994 | Mohsen | 257/209 |
| 5,382,832 A | 1/1995 | Buti et al. | 257/773 |
| 5,396,093 A | 3/1995 | Lu | 257/306 |
| 5,410,169 A | 4/1995 | Yamamoto et al. | 257/301 |
| 5,436,173 A | 7/1995 | Houston | 437/21 |
| 5,438,009 A | 8/1995 | Yang et al. | 437/52 |
| 5,497,017 A | 3/1996 | Gonzales | 257/306 |
| 5,504,357 A | 4/1996 | Kim et al. | 257/306 |
| 5,539,227 A | 7/1996 | Nakano | 257/276 |
| 5,593,921 A | 1/1997 | Chen et al. | 437/195 |
| 5,646,067 A | 7/1997 | Gaul | 437/180 |
| 5,705,425 A | 1/1998 | Miura et al. | 437/182 |
| 5,734,676 A | 3/1998 | Dingsor | 375/222 |
| 5,747,867 A | 5/1998 | Oppermann et al. | 257/507 |
| 5,760,456 A | 6/1998 | Grzegorek et al. | 257/531 |
| 5,798,544 A | 8/1998 | Ohya et al. | 257/296 |
| 5,874,770 A | 2/1999 | Saia et al. | 257/536 |
| 5,891,513 A | 4/1999 | Dubin et al. | 427/98 |
| 5,892,425 A | 4/1999 | Kuhn et al. | 336/200 |
| 5,892,707 A | 4/1999 | Noble | 365/149 |
| 5,903,489 A * | 5/1999 | Hayano | 365/51 |
| 5,930,596 A | 7/1999 | Klose et al. | 438/98 |
| 5,930,668 A | 7/1999 | Gardner | 438/624 |
| 5,969,422 A * | 10/1999 | Ting et al. | 257/762 |
| 5,989,623 A * | 11/1999 | Chen et al. | 427/97 |
| 6,025,261 A | 2/2000 | Farrar et al. | 438/619 |
| 6,037,258 A | 3/2000 | Liu et al. | 438/687 |
| 6,081,988 A | 7/2000 | Pluymers et al. | 29/601 |
| 6,181,163 B1 | 1/2001 | Agrawal et al. | 326/41 |
| 6,184,121 B1 * | 2/2001 | Buchwalter et al. | 438/622 |
| 6,239,684 B1 | 5/2001 | Farrar et al. | 336/200 |
| 6,271,087 B1 | 8/2001 | Kinoshita et al. | 438/258 |
| 6,376,895 B2 | 4/2002 | Farrar et al. | 257/531 |
| 6,377,156 B2 | 4/2002 | Farrar et al. | 366/200 |
| 6,458,690 B2 | 10/2002 | Takewaki et al. | 438/637 |

OTHER PUBLICATIONS

Ting, C. H., "Methods and Needs for Low K Material Research", *Materials Research Society Symposium Proceedings*, vol. 381, Low–Dielectric Constant Materials—Synthesis and Applications in Microelectronics, Lu, T.M., et al., (eds.), San Francisco, CA,(Apr. 17–19, 1995),3–17.

* cited by examiner

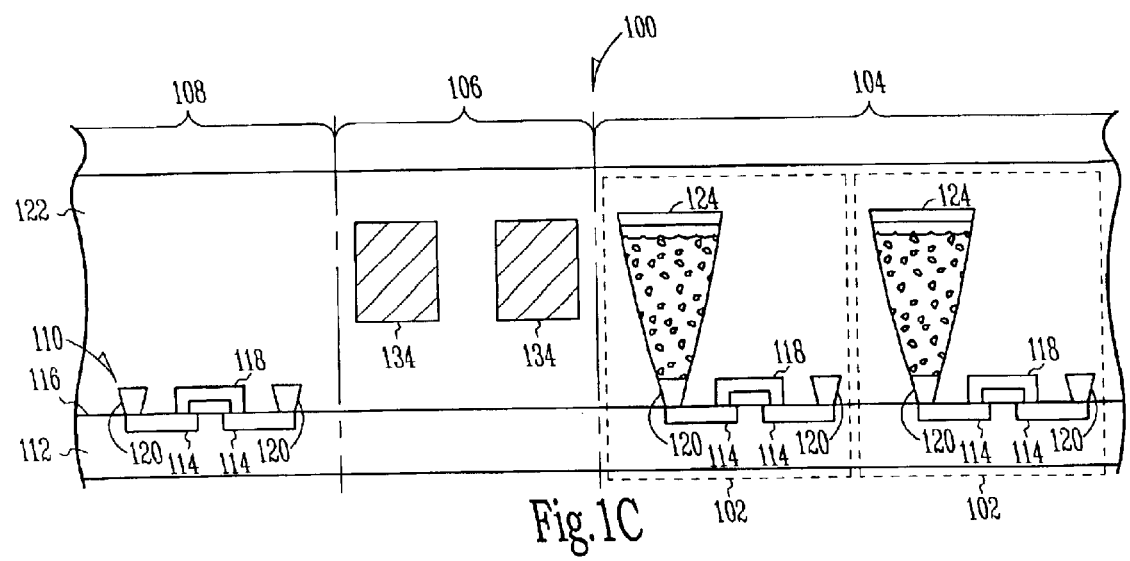
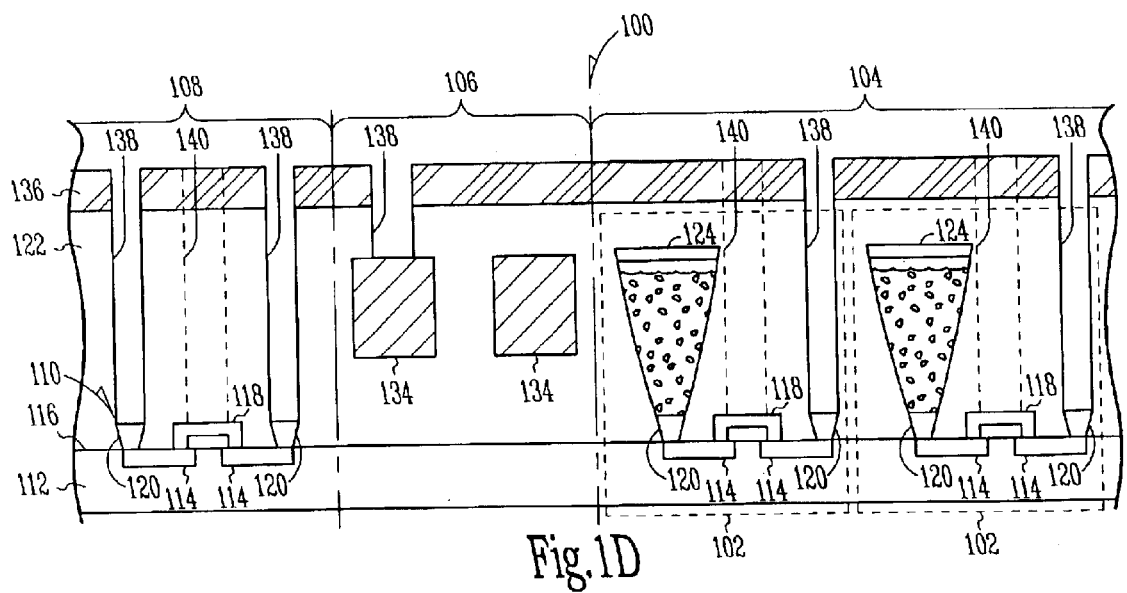

MICROELECTRONIC DIE INCLUDING LOW RC UNDER-LAYER INTERCONNECTS

This application is a divisional of U.S. application Ser. No. 10/095,362 filed on Mar. 11, 2002 now U.S. Pat. 6,624,515 which is incorporated herein by reference.

FIELD OF THE INVENTION

The present invention relates generally to microelectronic dies, semiconductor chips or the like, and more particularly to a microelectronic die including a low resistive/capacitive (RC) under-layer interconnect structure.

BACKGROUND OF THE INVENTION

In semiconductor chips, microelectronic dies or the like, some components may need to be interconnected for the transmission of signals between the components or so that power from a single source can be routed to the different components. These interconnected components are sometimes formed at different locations on the chip or die and can be at extreme distances across the die from one another because of design constraints. As the distance between interconnected components becomes longer, the more desirable that the conductive interconnect be denser or of a material to provide a lower resistance/capacitance (RC) interconnect for efficient and proper operation of the components. There is a tradeoff between providing denser, lower RC interconnects between components and the size of the microelectronic die or chip. Current structures providing additional low RC interconnects between components have necessitated that the dies or chips be made larger. However, the trend is to pack more components per square area on a die, to more efficiently utilize the available area on a die and to actually reduce the size of the die. Providing additional low RC interconnects between components can also result in several additional process steps that increase the time and expense of manufacturing the chip.

Accordingly, for the reasons stated above, and for other reasons that will become apparent upon reading and understanding the present specification, there is a need for low RC interconnects that efficiently utilize the available area on a microelectronic die without requiring additional area or requiring that the die be made bigger. Additionally, there is a need for a method of forming low RC interconnects that require a minimum of additional process steps and therefore minimize the additional time and expense of forming the low RC interconnects.

SUMMARY OF THE INVENTION

The above mentioned problems with forming low RC interconnects are addressed by the present invention and will be understood by reading and studying the following specification. Low RC interconnects, memory cells and systems are provided by the present invention that efficiently utilize the existing available area on a die and do not require that the die be made bigger. Methods of fabricating low RC interconnects, memory devices and systems are also provided by the present invention that require minimal additional processing and actually form the low RC interconnects utilizing some of the same operations used to form other components.

In accordance with the present invention, a microelectronic die includes a first area, a second area and an under-layer of conductive material formed in the second area to interconnect components.

In accordance with an embodiment of the present invention, a microelectronic die includes a first area and a second area. An elongated trench is formed in the second area and extends substantially across the microelectronic die. A line of metallization is formed in the elongated trench to transmit signals between different components or across the microelectronic die.

In accordance with another embodiment of the present invention an electronic system includes a processor and a memory system coupled to the processor. The memory system includes a layer of insulative material and an array of memory cells formed in a first area of the layer of insulative material. At least one trench is formed in a second area of the layer of insulative material. A plurality of components is formed in a third area of the layer of insulative material and at least one line of metallization formed in the at least one trench to transmit signals between the plurality of components.

In accordance with another embodiment of the present invention, a method of making a microelectronic die includes forming a layer of insulative material on a substrate; forming at least one trench in the layer of insulative material extending from proximate one edge of the microelectronic die to proximate another edge of the microelectronic die; and forming at least one line of conductive material in each of the at least one trenches to transmit signals across the microelectronic die.

These and other embodiments, aspects, advantages and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

In the drawings, like numerals describe substantially similar components throughout the several views. Like numerals having different letter suffixes or primed (X') represent different occurrences of substantially similar components.

FIGS. 1A–1F illustrate the operations in forming a microelectronic die including low RC under-layer interconnects in accordance with the present invention.

DESCRIPTION OF THE EMBODIMENTS

Figure 1A:
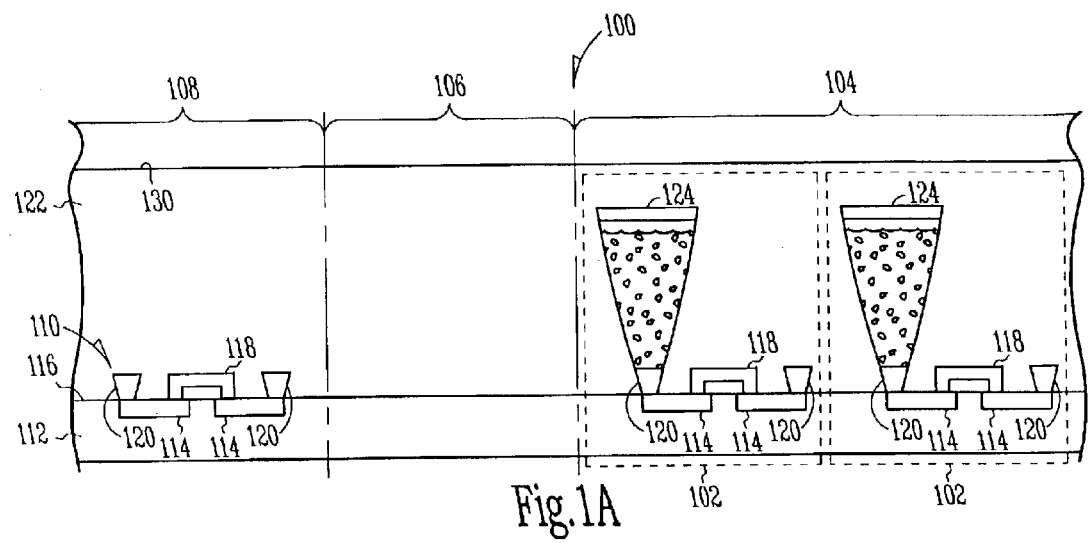

In the following detailed description of the preferred embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments can be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process operations may have been utilized to form regions/junctions in the base semiconductor structure. The following detailed description is, therefore, not to be taken in a limiting sense, and the scope of the present invention is defined only by the appended claims.

The transistors described herein include transistors from bipolar-junction technology (BJT), field effect technology (FET), or complimentary metal-oxide-semiconductor (CMOS) technology. A metal-oxide-semiconductor (MOS) transistor includes a gate, a first node (drain) and a second node (source). Since a MOS transistor is typically a symmetrical device, the true designation of "source" and "drain" is only possible once voltage is impressed on the terminals. The designations of source and drain herein should be interpreted, therefore, in the broadest sense. It should also be noted that a P-channel MOS transistor could alternatively be used for an N-channel MOS transistor and vice versa with the polarity of the associated gate voltages merely being reversed. For example, applying a negative gate voltage in the situation of a P-channel MOS transistor to activate the transistor and reversing the polarity to apply a positive gate voltage to activate an N-channel transistor if an N-channel MOS transistor is substituted for a P-channel transistor.

FIGS. 1A–1F illustrate the operations in forming a semiconductor die, microelectronic die 100 or the like including low RC under-layer interconnects in accordance with the present invention. As an example, the microelectronic die 100 shown in FIGS. 1A–1F is a memory system, such as a dynamic random access memory (DRAM) or the like. However, the principles and features of the present invention may be applied to any type microelectronic die containing other kinds of systems or devices. For the memory system example of the microelectronic die 100 in FIG. 1A, an array of memory cells 102 is formed in a first area 104 or core array of the microelectronic die 100. For other types of microelectronic dies, other kinds of devices or systems can be formed in the first area 104.

A second area 106 or peripheral area can separate the first area 104 from a third area 108 where other devices, such as transistors 110, as shown by way of example in FIG. 1A, can be formed. In another embodiment of the present invention (shown in FIG. 2), the second area 106 and the third area 108 can be combined or there may be a single peripheral area 202. Referring back to FIG. 1A, the microelectronic die 100 includes a substrate 112. Doped regions 114 can be formed in a surface 116 of the substrate 112 to provide source/drains for the memory cells 102 and the other devices or transistors 110. Insulated gates 118 can be formed over the doped source/drain (S/D) regions 114 to control operation of the memory cells 102 and transistors 110. A landing pad or plug 120 can be formed in contact with each of the doped S/D regions 114 to facilitate connection to a contact in a later operation. The landing pads or plugs 120 can be formed from polysilicon. A layer 122 of insulation material can be formed on the substrate 112 and a capacitor 124 can be formed and coupled to one of the doped regions 114 of each of the memory cells 102. The capacitors 124 can be formed by standard photolithographic and deposition techniques.

Figure 1B:
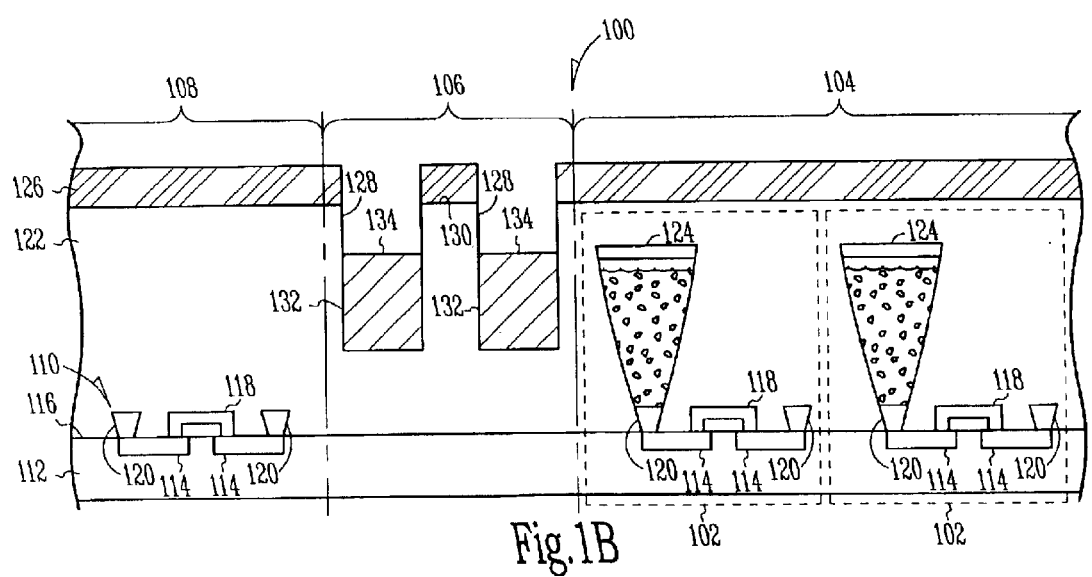

In FIG. 1B, in accordance with the present invention, a mask 126 can be formed on the insulation layer 122. The mask 126 has a predetermined pattern to form trenches 128 in the second area 106 in a top surface 130 of the insulation layer 122. The trenches 128 can be formed by a standard etching process. The trenches 128 can be elongated and extend substantially completely across the microelectronic die 100. A layer 132 of conductive material or metallization can be formed in each of the trenches 128. The layer 132 of conductive material can be for example copper, aluminum or an alloy of copper and aluminum to define an elongated low resistance/capacitance (RC) under-layer interconnect 134 or line of conductive material that can extend across the microelectronic die 100. The low RC interconnect 134 can be used to interconnect different components at different locations and distances from one another and can be used to transmit signals across the die 100 and between components or can be used to supply power across the die 100.

In FIG. 1C, the mask can be removed and the trenches 128 can be filed with insulation material to fill in the insulation layer 122 and to cover the low RC interconnects 134 or under-layers of conductive material.

In FIG. 1D, a second mask 136 can be formed on the insulation layer 122. The second mask 136 has a predetermined pattern to form vias 138 to expose the landing pads or contact plugs 120 and the under-layer interconnects 134. The second mask 136 can also be patterned to form vias 140 (shown by broken lines in FIGS. 1D–1F) at different locations on the die 100 to expose the gates 118. The vias 138 and 140 can be formed by standard etching processes.

Figure 1E:
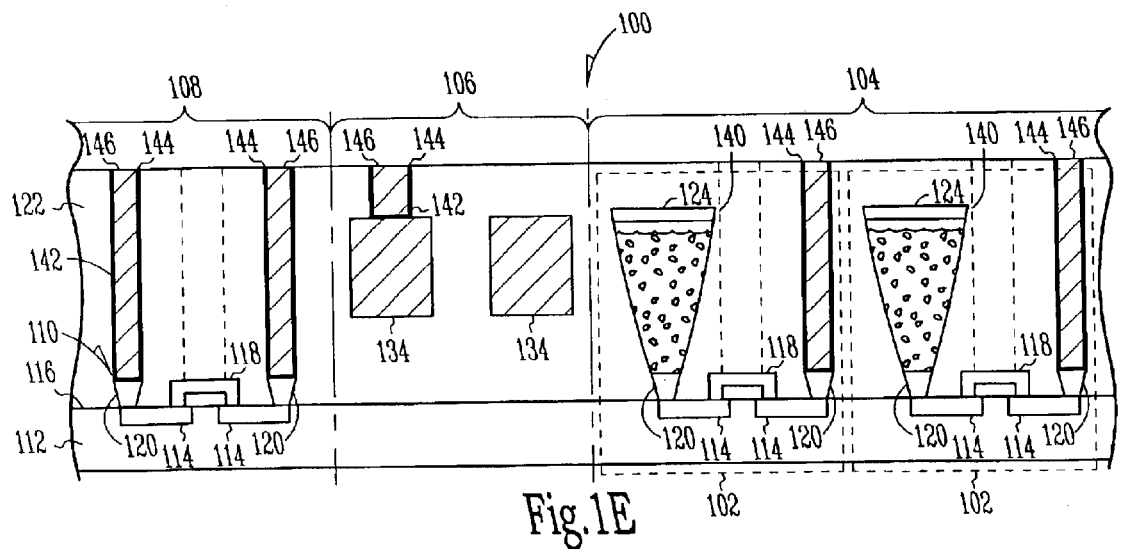

In FIG. 1E, contacts 142 of conductive material can be formed in the vias 138 and 140. The contacts 142 can be formed from any conductive material. For example, the contacts 142 can be formed by first forming a thin layer 144 of titanium to improve contact or adhesion to the plugs 120. A second layer 146 of tungsten can then be formed over the titanium layer 144 and to fill the vias 138 and 140 to complete formation of the contacts 142.

Figure 1F:
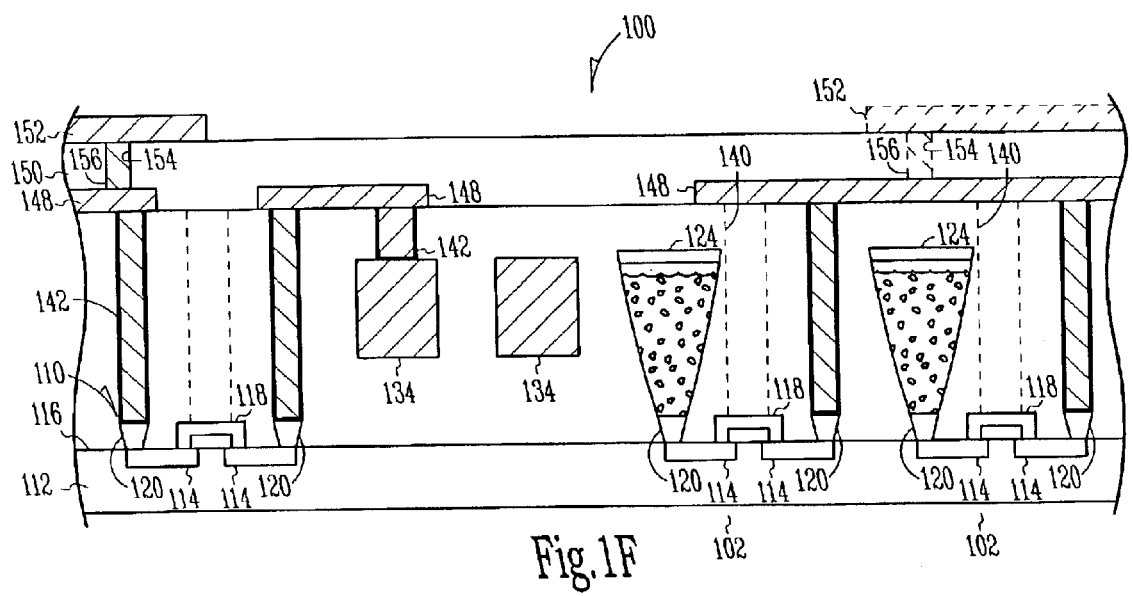

In FIG. 1F, subsequent processing operations can include forming a first layer 148 of metallization having a selected pattern to make contact to the memory cells 102, to at least one of the low RC under-layer interconnects 134 and to any devices or transistors 110 formed in the third area 108. The contacts 142 can connect the under-layer interconnects 134 to the first layer of metallization 148. Additional processing operations can include forming a second layer of insulation material 150 on the first layer 148 of metallization and exposed portions of the first insulation layer 122, and forming a second layer 152 of metallization on the second layer 150 of insulation material. Vias 154 can be formed in the second insulation layer 150 and contacts 156 can be formed in the vias 154 to make connections between the first layer 148 of metallization and second layer 152 of metallization.

Figure 2:
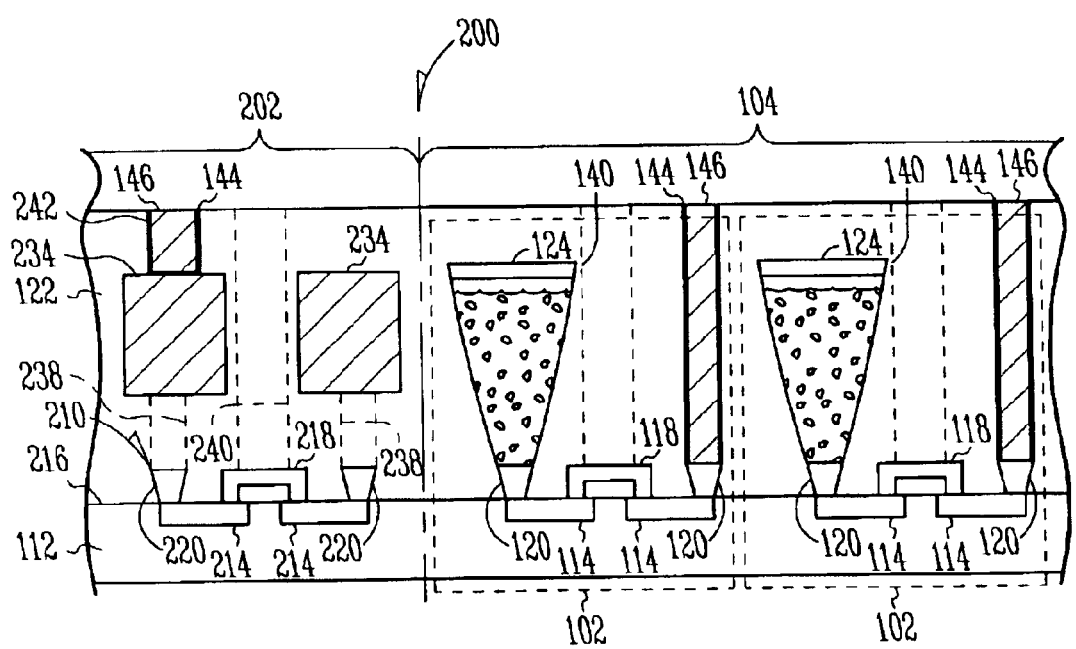
FIG. 2 is a cross-sectional view of a microelectronic die including low RC under-layer interconnects in accordance with another embodiment of the present invention.

FIG. 2 is a cross-sectional view of a microelectronic die 200 including low RC under-layer interconnects 234 in accordance with another embodiment of the present invention. The low RC interconnects 234 are similar to the RC interconnects 134 in FIGS. 1B–1F. In the microelectronic die 200, there is a single peripheral area 202. In the peripheral area 202, the under-layer interconnects 234 can be formed above or in the same area as the other devices or transistors 210. Contacts 242 to the transistors 210 and to the under-layer interconnects 234 can be made at different locations across the microelectronic die 200. The vias 238 and 240 to the gate 218 and plugs 220 of transistor 210 are shown by dashed or broken lines in FIG. 2 to illustrate that the vias 238 and 240 can be formed in different planes than the plane of the cross-section shown in FIG. 2.

Figure 3:
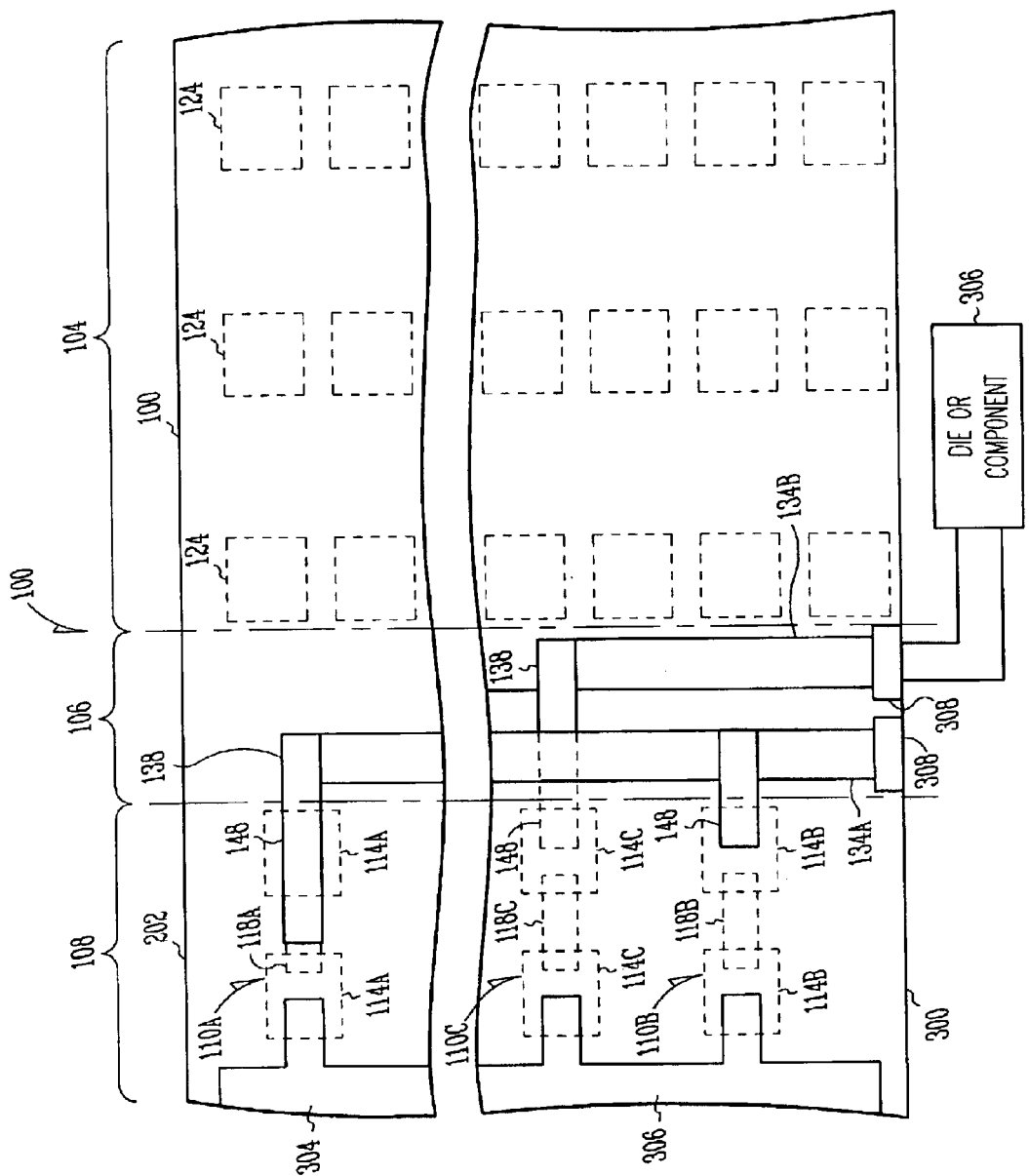
FIG. 3 is a top view of the microelectronic die of FIGS. 1A–1F including low RC under-layer interconnects in accordance with the present invention.

FIG. 3 is a top view of the microelectronic die 100 of FIGS. 1A–1F. Any upper layers of material have been removed in FIG. 3 to more clearly show the under-layer interconnects 134 and for purposes of understanding the present invention more clearly. As shown in FIG. 3, the under-layer interconnects 134 can extend substantially completely across one dimension of the microelectronic die 100 from proximate one edge 300 of the microelectronic die 100 to proximate another or opposite edge 302 of the microelectronic die 100. Accordingly, the under-layer interconnects 134 provide a low RC connection to transmit signals between different components at different locations and distances across the microelectronic die 100. For example, the low RC interconnect 134A can be connected to a first component or a gate 118A of a first transistor 110A formed in one portion 304 of the third area 108 and to a second component or one source/drain 114B of a second transistor 110B formed in another portion 306 of the third area 108 of the microelectronic die 100, and the interconnect 134B can be connected to one source/drain 114C of a third transistor 114C and to another component (not shown in FIG. 2) of the microelectronic die 100.

Figure 7:
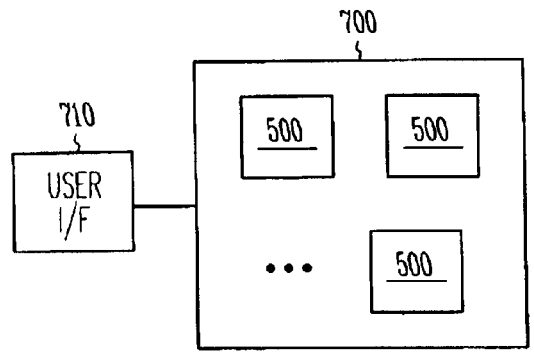
FIG. 7 is a block schematic diagram of an electronic system in accordance with another embodiment the present invention.
Figure 8:
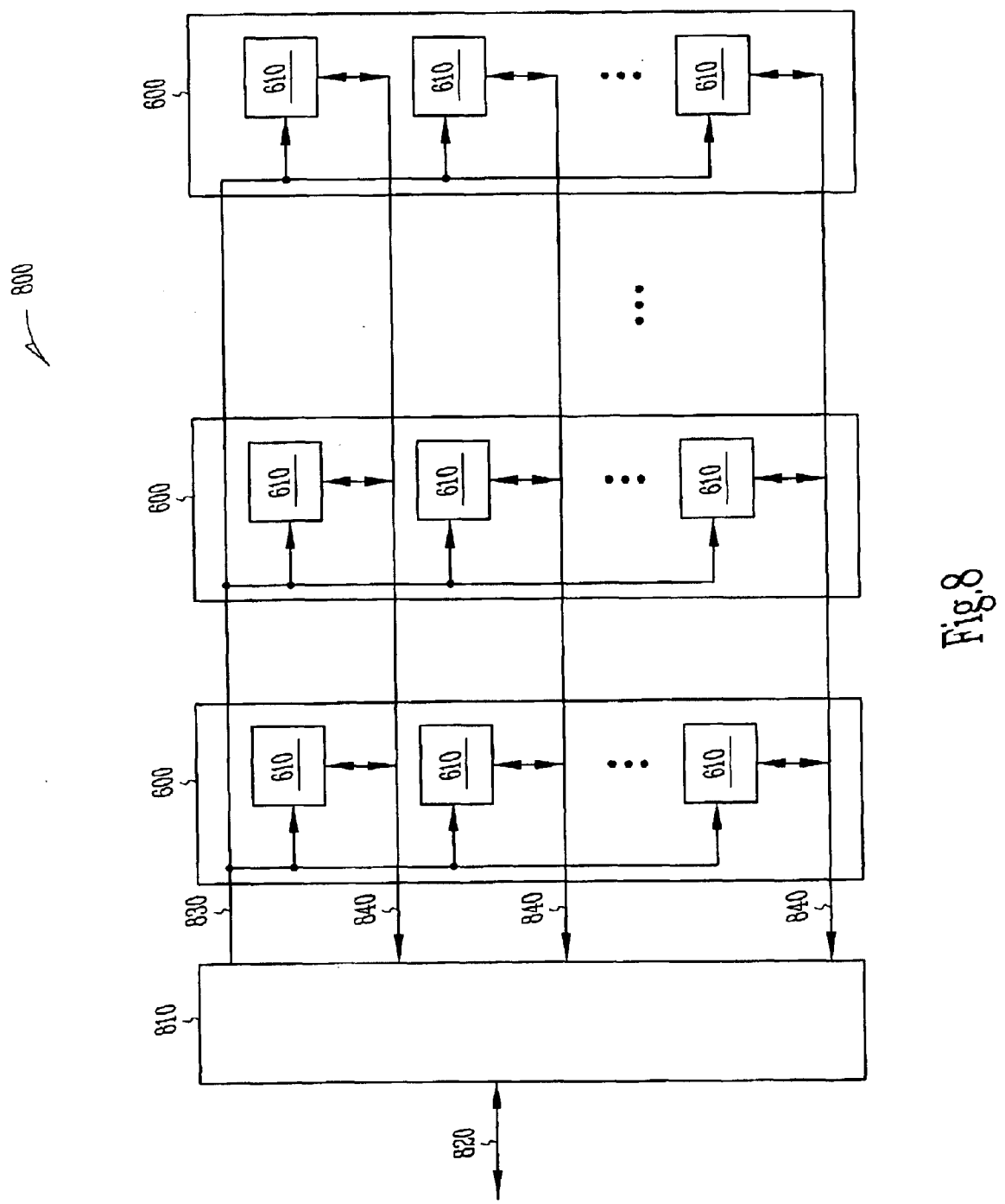
FIG. 8 is a block schematic diagram of a memory system in accordance with an embodiment of the present invention.
Figure 9:
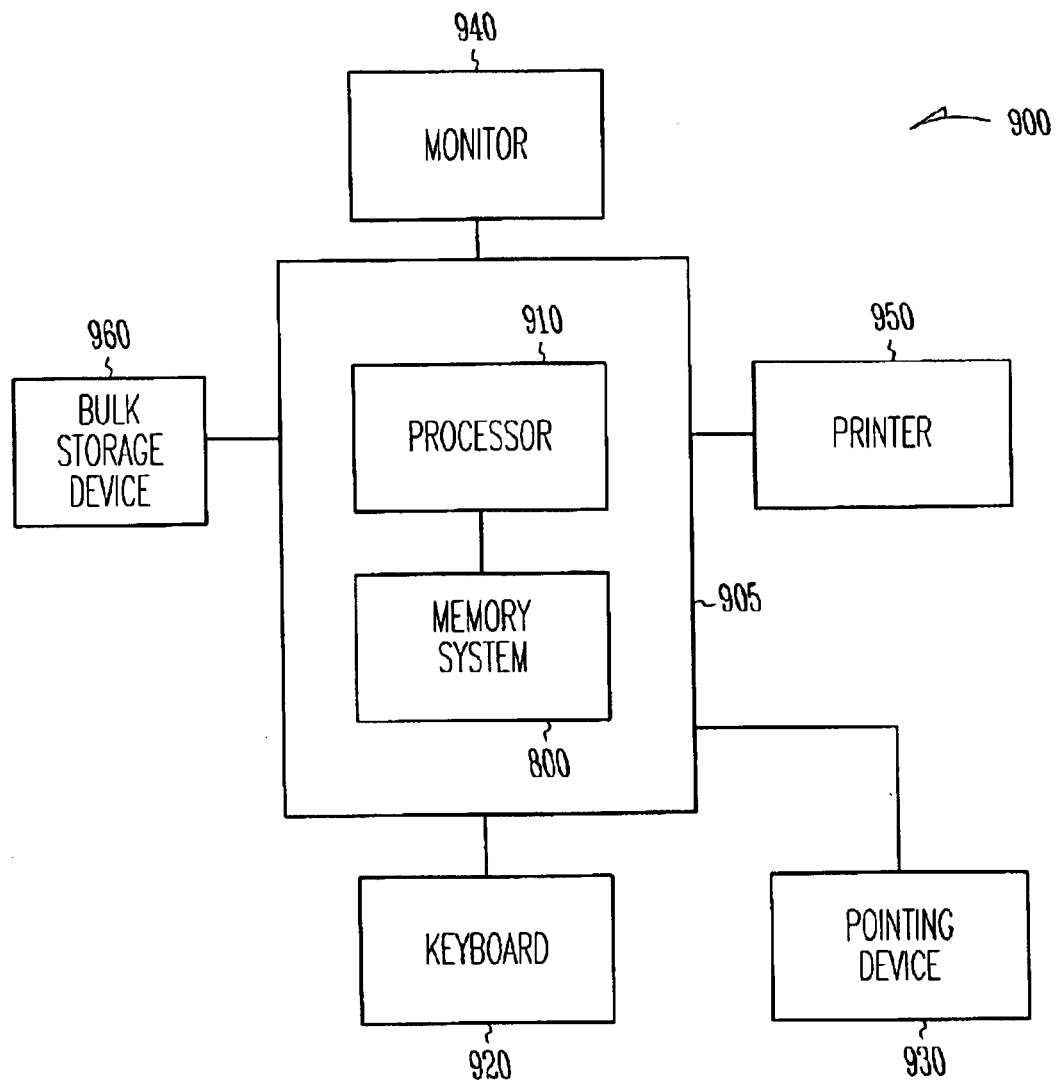
FIG. 9 is a block schematic diagram of a computer system in accordance with an embodiment of the present invention.

In another embodiment of the present invention, at least one of the under-layer interconnects 134 can be connected to a pad 308 or terminal at one or both edges 300 and 302 of the die 100 or at another location on the die 100 to couple the at least one interconnect 134 to another die or component 306 in an electronic system, such as a system 700, 800 or 900 shown in FIGS. 7, 8 and 9.

Figure 4:
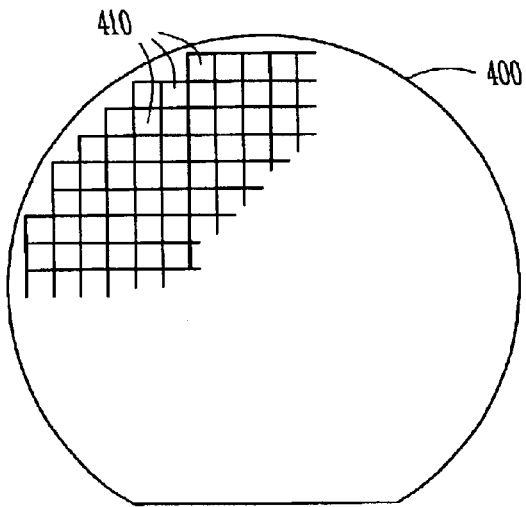
FIG. 4 is a top view of a wafer or substrate containing microelectronic or semiconductor dies in accordance with an embodiment of the present invention.

With reference to FIG. 4, a semiconductor or microelectronic die 410, similar to the microelectronic die 100 that includes low RC under-layer interconnects 134 as shown in FIGS. 1 and 2 in accordance with the present invention, can be produced from a silicon wafer 400. A die 410 is an individual pattern, typically rectangular, on a substrate that contains circuitry to perform a specific function. A semiconductor wafer 400 will typically contain a repeated pattern of such dies 410 containing the same functionality. Die 410 can further contain additional circuitry to extend to such complex devices as a monolithic processor with multiple functionality. Die 410 is typically packaged in a protective casing (not shown) with leads extending therefrom (not shown) providing access to the circuitry of the die 410 for unilateral or bilateral communication and control.

Figure 5:
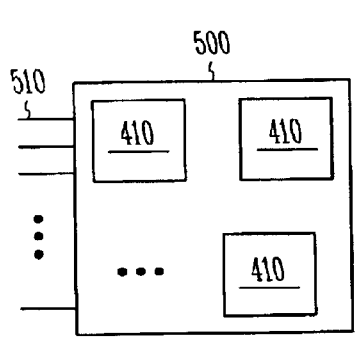
FIG. 5 is a block schematic diagram of a circuit module including microelectronic dies in accordance with an embodiment of the present invention.

As shown in FIG. 5, two or more dies 410, including the low RC interconnect structure 134 (FIGS. 1 and 2) in accordance with the present invention, can be combined, with or without a protective casing, into a circuit module 500 to enhance or extend the functionality of an individual die 410. Circuit module 500 can be a combination of dies 410 representing a variety of functions, or a combination of dies 410 containing the same functionality. Some examples of a circuit module 500 include memory modules, device drivers, power modules, communication modems, processor modules and application-specific modules and can include multi-layer, multi-chip modules. Circuit module 500 can be a sub-component of a variety of electronic systems, such as a clock, a television, a cell phone, a personal computer, an automobile, an industrial control system, an aircraft and others. Circuit module 500 will have a variety of leads 510 extending therefrom providing unilateral or bilateral communication and control.

Figure 6:
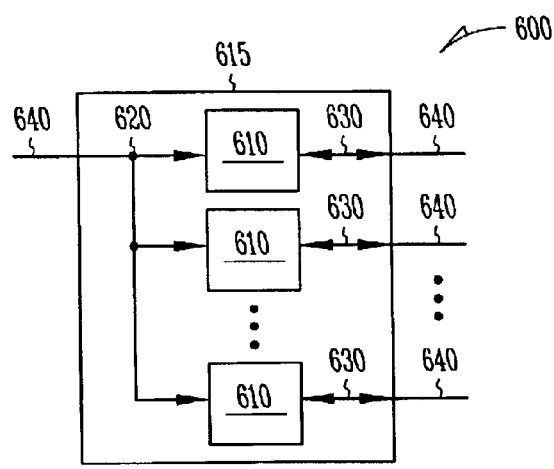
FIG. 6 is a block schematic diagram of a memory module including microelectronic dies in accordance with an embodiment of the present invention.

FIG. 6 shows one embodiment of a circuit module as a memory module 600 containing circuitry for the low RC interconnect structure 134 (FIG. 1) of the present invention. Memory module 600 generally depicts a Single In-line Memory Module (SIMM) or Dual In-line Memory Module (DIMM). A SIMM or DIMM can generally be a printed circuit board (PCB) or other support containing a series of memory devices. While a SIMM will have a single in-line set of contacts or leads, a DIMM will have a set of leads on each side of the support with each set representing separate I/O signals. Memory module 600 contains multiple memory devices 610 contained on support 615, the number depending upon the desired bus width and the desire for parity. Memory module 600 can contain memory devices 610 on both sides of support 615. Memory module 600 accepts a command signal from an external controller (not shown) on a command link 620 and provides for data input and data output on data links 630. The under-layer interconnects 134 of the present invention can be used to form the command link 620 and the data links 630. The command link 620 and data links 630 are connected to leads 640 extending from the support 615. Leads 640 are shown for conceptual purposes and are not limited to the positions shown in FIG. 6.

FIG. 7 shows an electronic system 700 containing one or more circuit modules 500 as described above containing the novel memory system 600 and the low RC interconnect structure 134 (FIG. 1) of the present invention. Electronic system 700 generally contains a user interface 710. User interface 710 provides a user of the electronic system 700 with some form of control or observation of the results of the electronic system 700. Some examples of user interface 710 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 710 can further describe access ports provided to electronic system 700. Access ports are used to connect an electronic system to the more tangible user interface components previously exemplified. One or more circuit modules, such as the circuit modules 500 in FIG. 5, can be a processor providing some form of manipulation, control or direction of inputs from or outputs to user interface 710, or of other information either preprogrammed into, or otherwise provided to, electronic system 700. As will be apparent from the lists of examples previously given, electronic system 700 will often contain certain mechanical components (not shown) in addition to the circuit modules 500 and user interface 710. It will be appreciated that the one or more circuit modules 500 in electronic system 700 can be replaced by a single integrated circuit. Furthermore, electronic system 700 can be a sub-component of a larger electronic system.

FIG. 8 shows one embodiment of an electronic system as memory system 800. Memory system 800 contains one or more memory modules 600 as described above including the interconnect structure 134 (FIGS. 1 and 2) in accordance with the present invention and a memory controller 810. Memory controller 810 provides and controls a bidirectional interface between memory system 800 and an external system bus 820. Memory system 800 accepts a command signal from the external bus 820 and relays it to the one or more memory modules 600 on a command link 830. Memory system 800 provides for data input and data output between the one or more memory modules 600 and external system bus 820 on data links 840. The under-layer interconnects 134 can form at least portions of the data links 840 and command links 830.

FIG. 9 shows a further embodiment of an electronic system as a computer system 900. Computer system 900 contains a processor 910 and a memory system 800 housed in a computer unit 905. Computer system 900 is but one example of an electronic system containing another electronic system, i.e. memory system 800. The memory system 800 can include an under-layer interconnect, shown as interconnect 134 in FIG. 1, in accordance with the present invention. Computer system 900 optionally contains user interface components. Depicted in FIG. 9 are a keyboard 920, a pointing device 930, a monitor 940, a printer 950 and a bulk storage device 960. It will be appreciated that other components are often associated with the computer system 900 such as modems, device driver cards, additional storage devices, etc. It will further be appreciated that the processor 910 and the memory system 800 of the computer system 900 can be incorporated on a single integrated circuit and can use the under-layer interconnect structure 134 of the present invention to interconnect the various components. Such single package processing units reduce the communication time between the processor 910 and the memory system 800.

CONCLUSION

The present invention thus provides low RC interconnects that efficiently utilize the available area on a microelectronic die without requiring additional area or that the die be made bigger. Additionally, the present invention provides a method of forming low RC interconnects that require a minimum of additional process steps and therefore minimize the additional time and expense of forming the additional low RC interconnects.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A method of making a microelectronic die, comprising:
   forming a layer of insulative material on a substrate;
   forming at least one trench in the layer of insulative material spaced above the substrate and extending from proximate one edge of the microelectronic die to proximate another edge of the microelectronic die; and
   forming at least one line of conductive material in each of the trenches encompassed by the insulative material to transmit signals across the microelectronic die.

2. The method of claim 1, further comprising:
   forming a layer of metallization on the layer of insulative material; and
   forming a contact in the layer of insulative material to make contact between the line of conductive material and the layer of metallization.

3. The method of claim 2, wherein forming the contact comprises:
   forming an opening in the layer of insulative material to expose a portion of the line of conductive material;
   forming a thin layer of titanium in the opening and on the exposed portion of the line of conductive material; and
   forming a contact of tungsten on the thin layer of titanium.

4. A method of making a microelectronic die, comprising:
   forming a layer of insulative material on a substrate;
   forming at least one device in a first area of the layer of insulative material; and
   forming an under-layer of conductive material in a second area spaced above the substrate and encompassed by the insulative layer.

5. The method of claim 4, further comprising:
   forming a first component in one portion of a third area; and
   forming a second component in another portion of the third area, wherein the first component and the second component are interconnected by the under-layer of conductive material.

6. The method of claim 4, wherein forming the at least one device comprises forming a memory system.

7. The method of claim 4, wherein forming the under-layer of conductive material comprises:
   forming a trench in the insulative layer; and
   forming a line of metallization in the trench.

8. A method of forming a microelectronic die, comprising:
   forming a layer of insulative material on a substrate;
   forming at least one device in a first area of the layer of insulative material;
   forming a trench in a second area of the layer of insulative material spaced above the substrate and extending substantially across the microelectronic die; and
   forming a line of metallization in the trench encompassed by the insulative material to transmit signals across the microelectronic die.

9. The method of claim 8, wherein forming the at least one device comprises forming an array of memory cells.

10. The method of claim 8, further comprising:
    forming a first component in one portion of a third area; and
    forming a second component in another portion of the third area, wherein the first component and the second component are interconnected by the line of metallization.

11. The method of claim 8, wherein forming the line of metallization comprises depositing a line including copper, aluminum or a combination of copper and aluminum.

12. A method of making a microelectronic die, comprising:
    forming a layer of insulative material on a substrate;
    forming an array of memory cells in a first area of the layer of insulative material;
    forming a trench in a second area of the layer of insulative material spaced above the substrate;
    forming a first component in a third area of the layer of insulative material;
    forming a second component in the third area of the layer of insulative material; and
    forming a line of metallization in the trench encompassed by the insulated material to transmit signals between the first component and the second component.

13. The method of claim 12, further comprising:
   forming a layer of metallization on the layer of insulative material; and
   forming a contact in the layer of insulative material to make contact between the layer of metallization and the line of metallization.

14. A method of making a microelectronic die, comprising:
   forming a layer of insulative material on a substrate;
   forming a device in a first area of the layer of insulative material;
   forming a plurality of trenches in a second area of the layer of insulative material spaced above the substrate;
   forming a plurality of components in a third area of the layer of insulative material; and
   forming a line of metallization in each of the trenches encompassed by the insulative material to transmit signals between the plurality of components.

15. A method of making a memory, comprising:
   forming a layer of insulative material on a substrate;
   forming an array of memory cells in a first area of the layer of insulative material; and
   forming an under-layer of conductive material in a second area spaced above the substrate and encompassed by the insulative layer.

16. The method of claim 15, wherein forming the under-layer of conductive material comprises:
   forming a trench in the insulative layer; and
   forming a line of metallization in the trench.

17. A method of making a memory, comprising:
   forming a layer of insulative material on a substrate;
   forming an array of memory cells in a first area of the layer of insulative material;
   forming at least one trench in a second area of the layer of insulative material spaced above the substrate and extending substantially completely along one dimension of the memory; and
   forming at least one line of conductive material in each of the at least one trenches encompassed by the insulative material to transmit signals across the memory.

18. The method of claim 17, further comprising:
   forming a layer of metallization on the layer of insulative material; and
   forming a contact in the layer of insulative material to make contact between the line of conductive material and the layer of metallization.

19. The method of claim 17, wherein forming the at least one line of conductive material comprises forming a line of metal to form a low RC interconnect.

20. A method of making an electronic system, comprising:
   forming a processor; and
   forming a memory system coupled to the processor, wherein forming the memory system includes:
      forming a layer of insulative material on a substrate;
      forming an array of memory cells in a first area of the layer of insulative material; and
      forming an under-layer of conductive material in a second area spaced above the substrate and encompassed by the insulative layer.

21. The method of claim 20, wherein forming the under-layer of conductive material comprises:
   forming a trench in the insulative layer; and
   forming a line of metallization in the trench.

22. A method of making an electronic system, comprising:
   forming a processor; and
   forming a memory system coupled to the processor, wherein forming the memory system includes:
      forming a layer of insulative material on a substrate;
      forming an array of memory cells in a first area of the layer of insulative material;
      forming at least one trench in a second area of the layer of insulative material spaced above the substrate and extending substantially completely along one dimension of the memory; and
      forming at least one line of conductive material in each of the at least one trenches encompassed by the insulative material to transmit signals across the memory.

23. The method of claim 22, wherein forming the at least one line of conductive material comprises forming a line of metal to form a low RC interconnect.

24. The method of claim 22, further comprising forming a plurality of components in a third area of the layer of insulative material, wherein the at least one layer of conductive material interconnects the plurality of components.

* * * * *